(12) United States Patent
Shi (10) Patent No.: US 11,899,307 B2
(45) Date of Patent: Feb. 13, 2024

(54) FLEXIBLE PRINTED CIRCUIT, LIGHT BAR, BACKLIGHT MODULE AND LIQUID CRYSTAL DISPLAY DEVICE

(71) Applicants: BOE Optical Science and Technology Co., Ltd., Jiangsu (CN); BOE Technology Group Co., Ltd., Beijing (CN)

(72) Inventor: Heya Shi, Beijing (CN)

(73) Assignees: BOE Optical Science and Technology Co., Ltd., Jiangsu (CN); BOE Technology Group Co., Ltd., Beijing (CN)

( * ) Notice: Subject to any disclaimer, the term of this patent is extended or adjusted under 35 U.S.C. 154(b) by 251 days.

(21) Appl. No.: 17/415,347

(22) PCT Filed: Sep. 25, 2020

(86) PCT No.: PCT/CN2020/117905
§ 371 (c)(1),
(2) Date: Jun. 17, 2021

(87) PCT Pub. No.: WO2022/061770
PCT Pub. Date: Mar. 31, 2022

(65) Prior Publication Data
US 2022/0326569 A1 Oct. 13, 2022

(51) Int. Cl.
*H05K 1/18* (2006.01)
*G02F 1/13357* (2006.01)
*H01L 33/62* (2010.01)

(52) U.S. Cl.
CPC ........ *G02F 1/133603* (2013.01); *H01L 33/62* (2013.01); *H05K 1/189* (2013.01); *H05K 2201/10136* (2013.01)

(58) Field of Classification Search
CPC .............................. H05K 1/111; H01L 33/62
See application file for complete search history.

(56) References Cited

U.S. PATENT DOCUMENTS 3,969,641 A * 7/1976 Oguchi ................. H03H 9/215
968/824
5,311,405 A * 5/1994 Tribbey ............. H05K 13/0465
361/767
(Continued)

FOREIGN PATENT DOCUMENTS

CN 202889784 U 4/2013
CN 106413284 A 2/2017
(Continued)

*Primary Examiner* — Andrew J Coughlin
(74) *Attorney, Agent, or Firm* — ArentFox Schiff LLP; Michael Fainberg (57) ABSTRACT

Embodiments of the present disclosure disclose a flexible printed circuit, a light bar, a backlight module and a liquid crystal display device. The flexible printed circuit includes a substrate and a plurality of groups of LED pads located on the substrate, wherein each group of the LED pads is configured to mount one LED lamp bead, each group of the LED pads includes a first pad, a second pad and a third pad, the firs pad, the second pad and the third pad are arranged sequentially in a first direction, the first pad and the second pad both receive a first voltage signal, the third pad receives a second voltage signal, and the first voltage signal is different from the second voltage signal.

14 Claims, 3 Drawing Sheets

(56) References Cited

U.S. PATENT DOCUMENTS

| | | | |
|---|---|---|---|
| 5,453,581 A * | 9/1995 | Liebman | H05K 1/111 |
| | | | 361/767 |
| 6,084,782 A | 7/2000 | Huynh et al. | |
| 6,169,253 B1 * | 1/2001 | Jairazbhoy | H05K 3/3442 |
| | | | 361/767 |
| 6,175,086 B1 * | 1/2001 | Nakamura | H05K 3/3485 |
| | | | 29/843 |
| 10,170,674 B2 * | 1/2019 | Miyashita | H01L 33/387 |
| 2004/0203189 A1 * | 10/2004 | Chen | H01L 33/486 |
| | | | 438/108 |
| 2008/0277677 A1 * | 11/2008 | Kuo | H05K 3/303 |
| | | | 257/91 |
| 2013/0026530 A1 * | 1/2013 | Jun | G09F 13/22 |
| | | | 257/E33.066 |
| 2013/0320371 A1 * | 12/2013 | Sugizaki | H05K 1/111 |
| | | | 257/98 |
| 2015/0331367 A1 * | 11/2015 | Bennett | G03G 15/1605 |
| | | | 399/314 |
| 2017/0103966 A1 * | 4/2017 | Choi | H01L 33/06 |
| 2021/0057624 A1 * | 2/2021 | Sun | H05K 1/0296 |
| 2022/0326569 A1 * | 10/2022 | Shi | H01L 33/62 |

FOREIGN PATENT DOCUMENTS

| | | |
|---|---|---|
| CN | 209002259 U | 6/2019 |
| CN | 209676597 U | 11/2019 |
| CN | 210137494 U | 3/2020 |
| JP | 2019169541 A | 10/2019 |

* cited by examiner

FLEXIBLE PRINTED CIRCUIT, LIGHT BAR, BACKLIGHT MODULE AND LIQUID CRYSTAL DISPLAY DEVICE

CROSS REFERENCE TO RELATED APPLICATIONS

This application is a national phase entry under 35 U.S.C. § 371 of International Application No. PCT/CN2020/117905, filed on Sep. 25, 2020, the entire content of which is incorporated herein by reference.

FIELD

The present disclosure relates to the field of a display technology, in particular to a flexible printed circuit, a light bar, a backlight module and a liquid crystal display device.

BACKGROUND

With the development of science and technology, liquid crystal display devices are being used more and more widely, especially in vehicle-mounted products. The liquid crystal display device includes a backlight module, and the backlight module includes a light bar which includes a flexible printed circuit and a plurality of lamp beads arranged on the flexible printed circuit. The flexible printed circuit includes a substrate and a plurality of groups of LED pads arranged on the substrate, wherein the plurality of groups of LED pads and the plurality of LED lamp beads are in one-to-one correspondence. Each group of the LED pads includes a positive electrode pad and a negative electrode pad which are arranged on the substrate, and the LED lamp bead corresponding to each group of the LED pads is welded to the positive and negative electrode pads in this group of LED pads respectively.

SUMMARY

A flexible printed circuit provided by embodiments of the present disclosure includes: a substrate; and a plurality of groups of LED pads, located on the substrate, each group of the LED pads being configured to mount one LED lamp bead, each group of the LED pads including a first pad, a second pad and a third pad.

The first pad, the second pad and the third pad are arranged sequentially in a first direction, the first pad and the second pad both receive a first voltage signal, the third pad receives a second voltage signal, and the first voltage signal being different from the second voltage signal.

Optionally, in the aforementioned flexible printed circuit provided by the embodiments of the present disclosure, the first pad and the second pad are negative electrode pads, and the third pad is a positive electrode pad.

Optionally, in the aforementioned flexible printed circuit provided by the embodiments of the present disclosure, the second pad is provided with a central axis extending in a second direction, the first direction is perpendicular to the second direction, and the first pad and the third pad are symmetrically arranged about the central axis.

Optionally, in the aforementioned flexible printed circuit provided by the embodiments of the present disclosure, widths, in the second direction, of the first pad, the second pad and the third pad are same; and a width, in the first direction, of the first pad is same as a width, in the first direction, of the third pad.

Optionally, in the aforementioned flexible printed circuit provided by the embodiments of the present disclosure, a width, in the first direction, of the second pad is greater than the width, in the first direction, of the first pad.

Optionally, in the aforementioned flexible printed circuit provided by the embodiments of the present disclosure, a distance between the first pad and the second pad is same as a distance between the second pad and the third pad.

Optionally, in the aforementioned flexible printed circuit provided by the embodiments of the present disclosure, the first pad and the third pad are square in shape.

Optionally, the aforementioned flexible printed circuit provided by the embodiments of the present disclosure further includes a line layer and a circuit structure. The line layer includes a plurality of lead wires for connecting the LED pads and the circuit structure; the first pad and the third pad are respectively connected to at least one of the lead wires, and at least one lead wire connected to the first pad and at least one lead wire connected to the third pad are symmetrically arranged relative to a central axis of the second pad.

Optionally, in the aforementioned flexible printed circuit provided by the embodiments of the present disclosure, the first pad is connected to a first lead wire, a second lead wire and a third lead wire respectively, the first pad includes a first side edge arranged opposite to the second pad, and the first lead wire, the second lead wire and the third lead wire are respectively electrically connected to other side edges other than the first side edge of the first pad.

The third pad is connected to a fourth lead wire, a fifth lead wire and a sixth lead wire respectively, the third pad includes a second side edge arranged opposite to the second pad, and the fourth lead wire, the fifth lead wire and the sixth lead wire are respectively electrically connected to other side edges other than the second side edge of the third pad.

The first lead wire and the fourth lead wire are symmetrically arranged relative to the central axis of the second pad, the second lead wire and the fifth lead wire are symmetrically arranged relative to the central axis of the second pad, and the third lead wire and the sixth lead wire are symmetrically arranged relative to the central axis of the second pad.

Optionally, in the aforementioned flexible printed circuit provided by the embodiments of the present disclosure, the first lead wire, the second lead wire, the third lead wire, the fourth lead wire, the fifth lead wire and the sixth lead wire are connected to center positions of the corresponding side edges respectively.

Optionally, in the aforementioned flexible printed circuit provided by the embodiments of the present disclosure, the second pad includes a third side edge arranged opposite to the first pad, a fourth side edge arranged opposite to the third pad, and a fifth side edge and a sixth side edge which are arranged opposite to each other and adjacent to the third side edge and the fourth side edge.

The second pad is connected to an even number of lead wires, and the even number of lead wires are connected to the fifth side edge and the sixth side edge respectively.

Optionally, in the aforementioned flexible printed circuit provided by the embodiments of the present disclosure, the fifth side edge is connected to a seventh lead wire, the sixth side edge is connected to an eighth lead wire, the seventh lead wire is connected to a center position of the fifth side edge, and the eighth lead wire is connected to a center position of the sixth side edge.

Accordingly, embodiments of the present disclosure further provide a light bar, including: the flexible printed circuit provided by the embodiments of the present disclosure, and a plurality of LED lamp beads welded on the flexible printed circuit through the plurality of groups of LED pads.

Accordingly, embodiments of the present disclosure further provide a backlight module, including the light bar provided by the embodiments of the present disclosure.

Accordingly, embodiments of the present disclosure further provide a liquid crystal display device, including the backlight module provided by the embodiments of the present disclosure.

DETAILED DESCRIPTION OF THE EMBODIMENTS

In order to make the objectives, technical solutions and advantages of the embodiments of the present disclosure clearer, the technical solutions of the embodiments of the present disclosure will be clearly and completely described below in conjunction with the accompanying drawings of the embodiments of the present disclosure. Apparently, the embodiments described are part of the embodiments of the present disclosure, rather than all the embodiments. Moreover, the embodiments in the present disclosure and features in the embodiments may be combined with each other without conflicts. All other embodiments obtained by those of ordinary skill in the art based on the described embodiments of the present disclosure without creative efforts shall fall within the protection scope of the present disclosure.

Unless otherwise defined, technical terms or scientific terms used in the present disclosure should have the ordinary meaning as understood by those of ordinary skill in the art to which the present disclosure belongs. As used in the present disclosure, the word "comprise/include" or "contain" or the like means that the element or article preceding this word covers the listed element(s) or article(s) appearing after this word and its/their equivalents, and does not exclude other elements or articles. Similar words such as "connect" or "connected" are not limited to physical or mechanical connection, but may include electrical connection, regardless of direct connection or indirect connection. The terms "inside", "outside", "upper", "lower" and the like are used only to indicate relative position relationships, and when the absolute position of an object described is changed, the relative position relationship may also be changed accordingly.

It should be noted that the size and shape of the figures in the accompanying drawings do not reflect the true scale and are merely for the purpose of illustrating the content of the present disclosure. Also, the same or similar reference numerals represent the same or similar elements or elements with the same or similar functions throughout.

Figure 1:
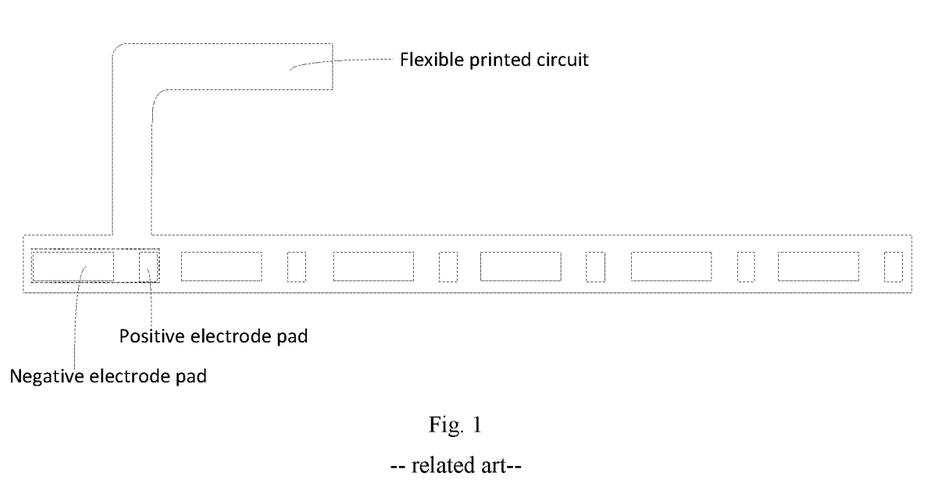
FIG. 1 is a structural schematic diagram of a flexible printed circuit provided in the related art.

With the development of science and technology, liquid crystal display devices are being used more and more widely, especially in vehicle-mounted display products. The liquid crystal display device includes a backlight module, and the backlight module includes a light bar which includes a flexible printed circuit (FPC) and LED lamp beads welded on the FPC. As shown in FIG. 1 which is a schematic diagram of the FPC, the FPC includes a plurality of groups of LED pads, wherein each group of the LED pads includes a positive electrode pad and a negative electrode pad, each LED lamp bead includes a positive electrode weld leg and a negative electrode weld leg, the positive and negative electrode pads of each group of the LED pads and the positive and negative electrode weld legs of the LED lamp bead are in one-to-one correspondence.

Figure 2:
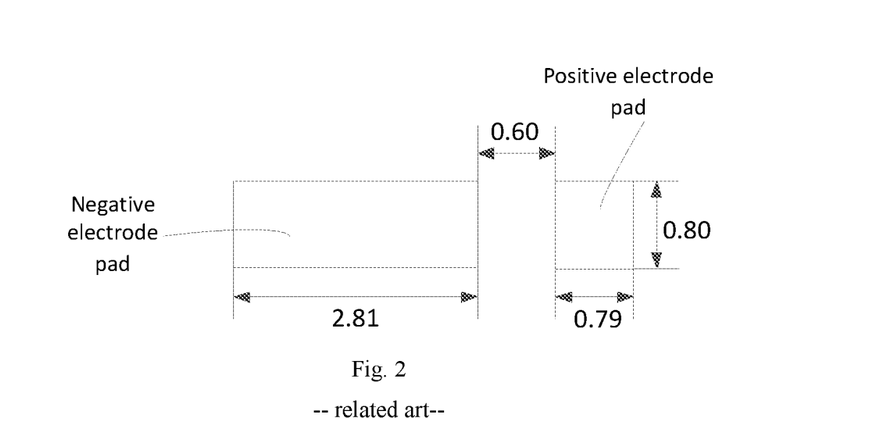
FIG. 2 is a schematic size diagram of a positive electrode pad and a negative electrode pad on the flexible printed circuit.

With increased brightness and reliability requirements of the vehicle-mounted products on liquid crystal display modules, large-small pad packaging structures appear for LED pads, that is, the size of the positive electrode pads on the FPC is obviously smaller than the size of the negative electrode pads a lot. As shown in FIG. 2 which is a schematic size diagram of the positive and negative electrode pads currently employed, such traditional design approach will cause a problem, that is, the positive electrode pad and the negative electrode pad are not the same in size, and the amounts of tin paste brushed thereon are different. After the tin paste is melted, the phenomenon that the positive and negative electrode pads of the LED lamp bead are unevenly stressed in reflow welding of the LED lamp bead will occur. When the left and right of the LED lamp bead are unevenly stressed, it will easily cause problems of offset of the LED lamp bead and large angle, resulting in phenomena of vehicle-mounted backlight leakage and poor optics.

Figure 3:
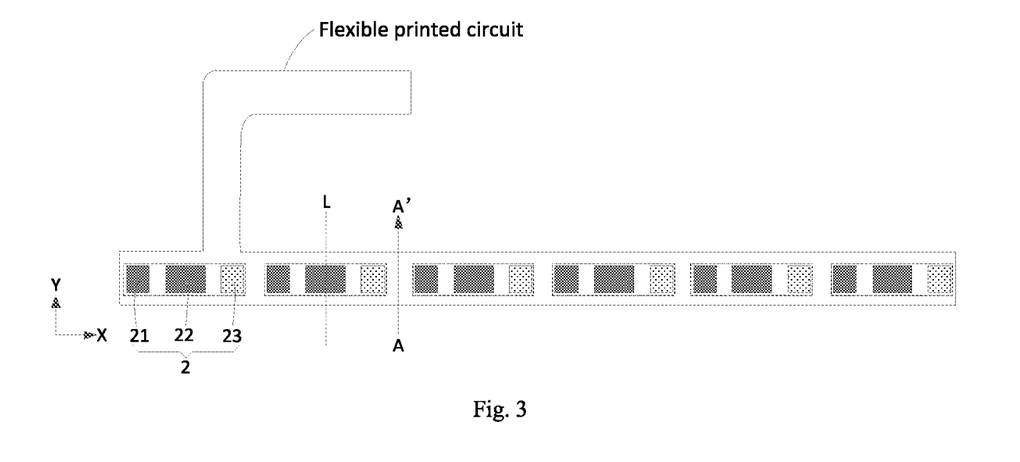
FIG. 3 is a structural schematic diagram of a flexible printed circuit provided by embodiments of the present disclosure.
Figure 4:
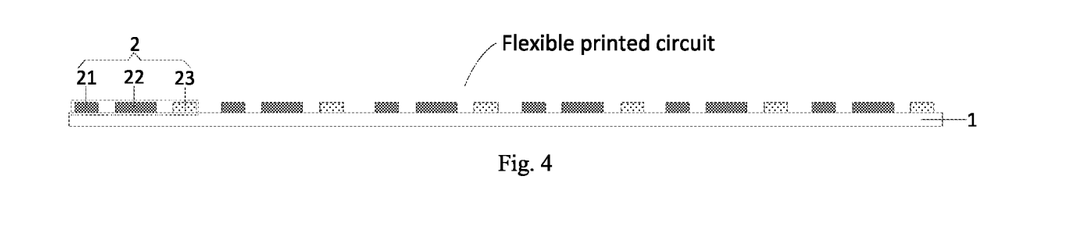
FIG. 4 is a schematic diagram corresponding to the AA' direction in FIG. 3.

In view of this, the flexible printed circuit provided by the embodiments of the present disclosure is as shown in FIG. 3 and FIG. 4. FIG. 3 is a structural schematic diagram of the flexible printed circuit, and FIG. 4 is a schematic diagram in the direction AA' in FIG. 3. In combination with FIG. 3 and FIG. 4, the flexible printed circuit may include: a substrate 1; and a plurality of groups of LED pads 2, located on the substrate 1.

Each group of the LED pads 2 is configured to mount one LED lamp bead, each group of the LED pads 2 includes a first pad 21, a second pad 22 and a third pad 23, the first pad 21, the second pad 22 and the third pad 23 are arranged sequentially in a first direction X, the first pad 21 and the second pad 22 both receive a first voltage signal, the third pad receives a second voltage signal, and the first voltage signal is different from the second voltage signal. For example, the first voltage signal is a negative voltage signal, and the second voltage signal is a positive voltage signal.

In the aforementioned flexible printed circuit provided by the embodiments of the present disclosure, each group of the LED pads 2 on the flexible printed circuit is set to include the first pad 21, the second pad 22 and the third pad 23 which are arranged sequentially along the first direction X, the first pad 21 and the second pad 22 both receive a first voltage signal, the third pad 23 receives a second voltage signal, and the first voltage signal is different from the second voltage signal; and in the present disclosure, the two pads in the original group of LED pads are set into three pads, for example, the original negative electrode pad is set into the first pad 21 and the second pad 22. In this way, when the positive and negative electrode weld legs of LED lamp bead are welded, the tin paste on the first pad 21 and the tin paste on the second pad 22 are independent of each other after melting, and design of the size of the first pad 21 may cause the amounts of tin paste on the first pad 21 and the third pad 23 to be equivalent, so the tin paste on the first pad 21 and the tin paste on the third pad 23 are stressed consistently, which will not cause problems of offset of the LED lamp bead and large angle after SMT reflow welding, thereby avoiding the phenomena of backlight leakage and poor optics of the vehicle-mounted display products and ensuring the vehicle-mounted backlight brightness and the stability of light emission effects.

It should be noted that in the embodiments of the present disclosure, only the flexible printed circuit including 6 groups of LED pads 2 is taken as an example, and optionally, the flexible printed circuit may further include other number of groups (such as 25 groups) of LED pads 2, which is not limited by the embodiments of the present disclosure.

During specific implementation, in the aforementioned flexible printed circuit provided by the embodiments of the present disclosure, as shown in FIG. 3, the first pad 21 and the second pad 22 may be negative electrode pads for being welded to the negative electrode weld leg of the LED lamp bead, and the third pad 23 may be a positive electrode pad for being welded to the positive electrode weld leg of the LED lamp bead.

It should be noted that the embodiments of the present disclosure take the case where the length of the positive electrode pad is smaller than the length of the negative electrode pad as an example, and of course, the length of the positive electrode pad may also be greater than or equal to the length of the negative electrode pad, which is not limited by the embodiments of the present disclosure. When the length of the positive electrode pad is greater than the length of the negative electrode pad, the positive electrode pad is set into two parts, for example, a first part close to the negative electrode and a second part away from the negative electrode, and the second part and the negative electrode pad are symmetrically arranged and the same in size.

During specific implementation, in order to further ensure that the tin paste on the first pad and the tin paste on the second pad are stressed consistently, in the aforementioned flexible printed circuit provided by the embodiments of the present disclosure, as shown in FIG. 3, the second pad 22 is provided with a central axis L extending in a second direction Y, the first direction X is perpendicular to the second direction Y, and the first pad 21 and the third pad 23 are symmetrically arranged about the central axis L.

Figure 5:
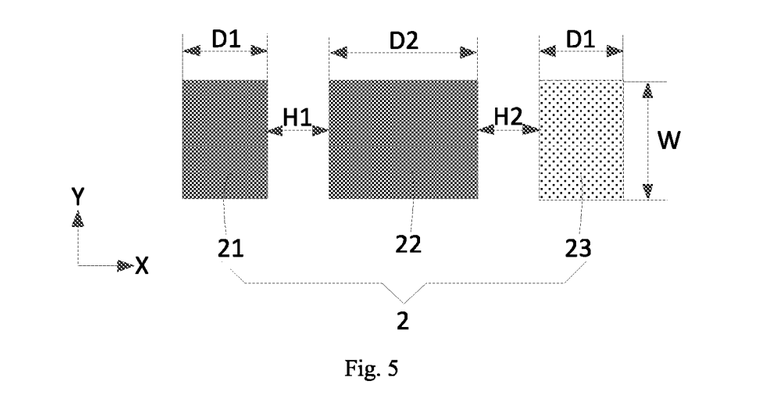
FIG. 5 is an enlarged schematic diagram of a group of LED pads in FIG. 3.

During specific implementation, in the aforementioned flexible printed circuit provided by the embodiments of the present disclosure, as shown in FIG. 3 and FIG. 5, FIG. 5 is an enlarged schematic diagram of the group of LED pads 2 in FIG. 3, the first pad 21, the second pad 22 and the third pad 23 have the same width in the second direction Y, and the widths are all W.

A width, in the first direction X, of the first pad 21 is same as a width, in the first direction X, of the third pad 23, and the widths of the first pad 21 and the third pad 23 are both D1. Thus, the first pad 21 and the third pad 23 are same in size, which may ensure that the amounts of tin paste on the first pad 21 and the third pad 23 are the same, and the tin paste on the first pad 21 and the tin paste on the third pad 23 are evenly stressed, which may ensure that the positive and negative electrode weld legs of the LED lamp bead are stably welded to the LED pads on the flexible printed circuit, thereby further ensuring the vehicle-mounted backlight brightness and the stability of light emission effects.

During specific implementation, in the aforementioned flexible printed circuit provided by the embodiments of the present disclosure, as shown in FIG. 3 and FIG. 5, a width D2 of the second pad 22 is greater than the width D1 of the first pad 21 in the first direction X. This is because the positive electrode pad in the original LED pads is much smaller than the negative electrode pad, the original negative electrode pad is set into the first pad 21 and the second pad 22 which are independent, and the first pad 21 and the original positive electrode pad (i.e., the third pad 23) are the same in size. Therefore, the width D2 of the second pad 22 will be still greater than the width D1 of the first pad 21, that is, the size of the second pad 22 is greater than the size of the first pad 21 and the size of the third pad 23.

During specific implementation, in order to further ensure that the tin paste on the first pad and the tin paste on the second pad are evenly stressed, in the aforementioned flexible printed circuit provided by the embodiments of the present disclosure, as shown in FIG. 3 and FIG. 5, a distance H1 between the first pad 21 and the second pad 22 is the same as a distance H2 between the second pad 22 and the third pad 23.

During specific implementation, in the aforementioned flexible printed circuit provided by the embodiments of the present disclosure, as shown in FIG. 3 and FIG. 5, the first pad 21 and the third pad 23 may be square in shape. Of course, the square does not refer to a perfect square, and the four corners of the square may be either right angles or arc-shaped angles.

Figure 6:
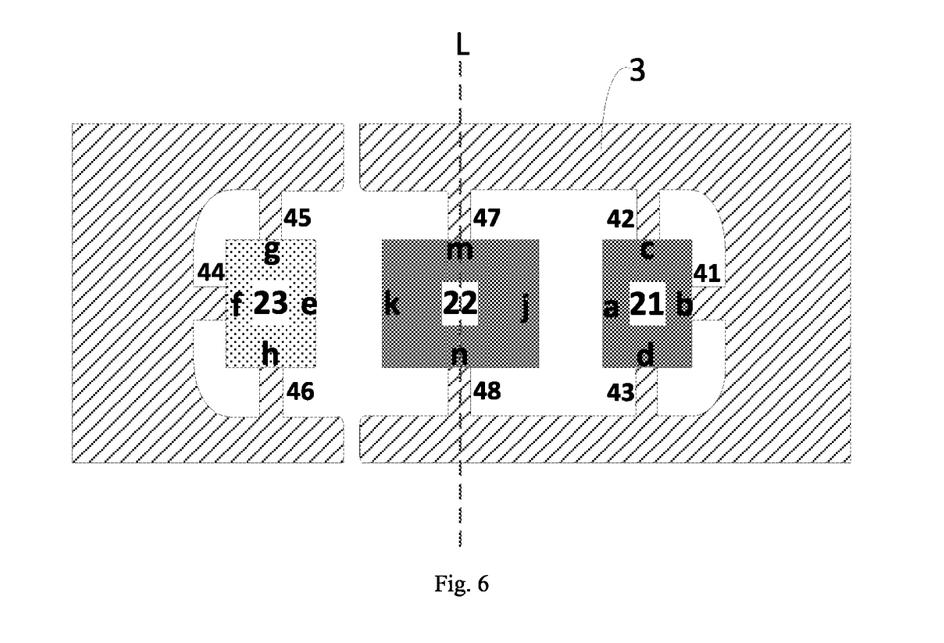
FIG. 6 is an enlarged schematic diagram of the group of LED pads in FIG. 3 and lead wires connected thereto.

During specific implementation, as shown in FIG. 6 which is an enlarged schematic diagram of a region corresponding to the group of LED pads 2 in FIG. 3, the aforementioned flexible printed circuit provided by the embodiments of the present disclosure further includes a line layer and a circuit structure 3, and the line layer includes a plurality of lead wires for connecting the LED pads 2 and the circuit structure 3 (for example, lead wires 41, 42, 43, 44, 45, 46, 47, 48 . . . ).

At least one lead wire connected to the first pad 21 and at least one lead wire connected to the third pad 23, and FIG. 6 takes the case where the first pad 21 is connected to three wires and the third pad 23 is connected to three lead wires as an example. As tin after melting will flow on the lead wires electrically connected to the pads, in order to ensure that the left and right of the LED pads are evenly stressed, the lead wires respectively connected to the first pad 21 and the third pad 23 are symmetrically arranged relative to a central axis L of the second pad 22. In this way, the amounts of tin paste on the lead wires respectively connected to the first pad 21 and the third pad 23 are also the same, which further ensures that the left and right of the LED pads are evenly stressed and ensures the vehicle-mounted backlight brightness and the stability of light emission effects.

It should be noted that FIG. 3 and FIG. 6 in the embodiments of the present disclosure do not specifically illustrate the schematic diagram of the circuit structure 3, conductive patterns on the flexible printed circuit can all be obtained by etching a copper foil, the conductive patterns include the LED pads 2, the lead wires (41, 42, 43, 44, 45, 46, 47, 48 . . . ) and the circuit structure 3 provided by the embodiments of the present disclosure, the circuit structure 3 is a structure composed of TFTs, and an external power supply provides a positive voltage and a negative voltage corresponding to the LED lamp bead to the positive electrode pad (the third pad 23) and the negative electrode pad (the first pad 21 and the second pad 22) through the circuit structure 3 and the lead wires, so as to realize light emission of the LED lamp bead to serve as a backlight source of the liquid crystal display device.

During specific implementation, in the aforementioned flexible printed circuit provided by the embodiments of the present disclosure, as shown in FIG. 6, the first pad 21 is connected to the first lead wire 41, the second lead wire 42 and the third lead wire 43 respectively, the first pad 21 includes a first side edge 'a' arranged opposite to the second pad 22, and the first lead wire 41, the second lead wire 42 and the third lead wire 43 are respectively electrically connected to the other side edges ('b', 'c', 'd') other than the first side edge 'a' of the first pad. Specifically, the first lead wire 41 is electrically connected to the side edge 'b', the second lead wire 42 is electrically connected to the side edge 'c', and the third lead wire 43 is electrically connected to the side edge 'd'.

The third pad 23 is connected to the fourth lead wire 44, the fifth lead wire 45 and the sixth lead wire 46 respectively, the third pad 23 includes a second side edge 'e' arranged opposite to the second pad 22, and the fourth lead wire 44, the fifth lead wire 45 and the sixth lead wire 46 are respectively electrically connected to the other side edges (T, 'g', 'h') other than the second side edge 'e' of the third pad. Specifically, the fourth lead wire 44 is electrically connected to the side edge T, the fifth lead wire 45 is electrically connected to the side edge 'g', and the sixth lead wire 46 is electrically connected to the side edge 'h'.

The first pad 21 and the third pad 23 in the embodiments of present disclosure are respectively connected to three lead wires, in order to achieve that when one of the lead wires is broken during bending of the flexible printed circuit, a voltage may also be provided to the positive and negative electrodes of the LED lamp bead through the other wires to ensure light emission of the LED lamp bead. As the first pad 21 and the third pad 23 are the outermost pads in a group of LED pads 2, when various lead wires respectively electrically connected to the first pad 21 and the third pad 23 are distributed in disorder, it is likely to cause a case of uneven stresses on the left and right after melting of the tin paste, resulting in problems of offset of the LED lamp bead and large angle after SMT reflow welding.

Therefore, in order to solve the problem of uneven stresses on the left and right due to the lead wires connected to the respective pads, in the embodiments of the present disclosure, the first lead wire 41 and the fourth lead wire 44 are symmetrically arranged relative to the central axis L of the second pad 22, the second lead wire 42 and the fifth lead wire 45 are symmetrically arranged relative to the central axis L of the second pad 22, and the third lead wire 43 and the sixth lead wire 46 are symmetrically arranged relative to the central axis L of the second pad 22. Thus, the amounts of tin paste on the lead wires respectively connected to the first pad 21 and the third pad 23 are the same, which further ensures that the left and right of the LED pads are evenly stressed and ensures the vehicle-mounted backlight brightness and the stability of light emission effects.

During specific implementation, in order to further ensure that the left and right of the LED pads are evenly stressed, in the aforementioned flexible printed circuit provided by the embodiments of the present disclosure, as shown in FIG. 6, the first lead wire 41, the second lead wire 42, the third lead wire 43, the fourth lead wire 44, the fifth lead wire 45 and the sixth lead wire 46 are connected to center positions of the corresponding side edges respectively. Specifically, the first lead wire 41 is connected to the center position of the side edge 'b', the second lead wire 42 is connected to the center position of the side edge 'c', the third lead wire 43 is connected to the center position of the side edge 'd', the fourth lead wire 44 is connected to the center position of the side edge the fifth lead wire 45 is connected to the center position of the side edge 'g', and the sixth lead wire 46 is connected to the center position of the side edge 'h'. In this way, the first pad 21 and the third pad 23 are stressed consistently at each position to ensure smooth welding of the LED lamp beads.

During specific implementation, in the aforementioned flexible printed circuit provided by the embodiments of the present disclosure, as shown in FIG. 6, the second pad 22 includes a third side edge T arranged opposite to the first pad 21, a fourth side edge 'k' arranged opposite to the third pad 23, and a fifth side edge 'm' and a sixth side edge 'n' which are arranged opposite to each other and adjacent to the third side edge 'j' and the fourth side edge 'k'.

In order to ensure that the second pad 22 is stressed evenly at each position and ensure the stability of voltage signal transmission, the second pad 22 is connected to an even number of lead wires (taking 2 lead wires as an example in the present disclosure), and the even number of lead wires are correspondingly connected to the fifth side edge 'm' and the sixth side edge 'n'.

During specific implementation, in the aforementioned flexible printed circuit provided by the embodiments of the present disclosure, as shown in FIG. 6, the fifth side edge 'm' is connected to the seventh lead wire 47, the sixth side edge 'n' is connected to the eighth lead wire 48, the seventh lead wire 47 is connected to the center position of the fifth side edge 'm', and the eighth lead wire 48 is connected to the center position of the sixth side edge 'n'. Thus, the third pad 22 may be stressed consistently at each position to ensure smooth welding of the LED lamp beads.

During specific implementation, the flexible printed circuit provided by the embodiments of the present disclosure may further include other film layers known to those skilled in the art, which will not be described in detail here.

Based on the same inventive concept, embodiments of the present disclosure further provide a light bar, including the flexible printed circuit provided by the embodiments of the present disclosure, and a plurality of LED lamp beads welded on the flexible printed circuit through the plurality of groups of LED pads. The principle that the light bar solves problems is similar to that of the aforementioned flexible printed circuit, so that the implementation of the light bar may be referenced to the implementation of the aforementioned flexible printed circuit, and repetition is not elaborated here.

Based on the same inventive concept, embodiments of the present disclosure further provide a backlight module, including the light bar provided by the embodiments of the present disclosure. The principle that the backlight module solves problems is similar to that of the aforementioned flexible printed circuit, so that the implementation of the backlight module may be referenced to the implementation of the aforementioned flexible printed circuit, and repetition is not elaborated here.

Based on the same inventive concept, embodiments of the present disclosure further provide a liquid crystal display device, including the backlight module provided by the embodiments of the present disclosure. The principle that the liquid crystal display device solves problems is similar to that of the aforementioned flexible printed circuit, so that the implementation of the liquid crystal display device may be referenced to the implementation of the aforementioned organic light-emitting display panel, and repetition is not elaborated here.

Specifically, the display device may be a tablet computer, a TV set, a display, a notebook computer, a digital photo frame, a navigator and any product or component with a display function. Other essential constituent parts of the display device should all be understood by those of ordinary skill in the art, which are not repeated here and also should not be used as limitations to the present disclosure.

According to the aforementioned flexible printed circuit, the light bar, the backlight module and the liquid crystal display device provided by the embodiments of the present disclosure, each group of the LED pads on the flexible printed circuit is set to include the first pad, the second pad and the third pad which are arranged sequentially along the first direction, the first pad and the second pad both receive a first voltage signal, the third pad receives a second voltage signal, and the first voltage signal is different from the second voltage signal; and in the present disclosure, the two pads in the original group of LED pads are set into three pads, for example, the original negative electrode pad is set into the first pad and the second pad. In this way, when the positive and negative electrode weld legs of LED lamp bead are welded, the tin paste on the first pad and the tin paste on the second pad are independent of each other after melting, and design of the size of the first pad can cause the amounts of tin paste on the first pad and the third pad to be equivalent, so the tin paste on the first pad and the tin paste on the third pad are stressed consistently, which will not cause problems of offset of the LED lamp bead and large angle after SMT reflow welding, thereby avoiding the phenomena of backlight leakage and poor optics of the vehicle-mounted display products, and ensuring the vehicle-mounted backlight brightness and the stability of light emission effects.

Although the preferred embodiments of the present disclosure have been described, those skilled in the art can make other changes and modifications to these embodiments once they learn the basic inventive concept. Therefore, the appended claims are intended to be construed as including the preferred embodiments and all changes and modifications falling within the scope of the present disclosure.

Obviously, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent technologies, the present disclosure is also intended to include these modifications and variations.

What is claimed is:

1. A flexible printed circuit, comprising:
   a substrate; and
   a plurality of groups of LED pads on the substrate;
   wherein each group of the LED pads is configured to mount one LED lamp bead and comprises:
     a first pad,
     a second pad, and
     a third pad;
     wherein the first pad, the second pad and the third pad are arranged sequentially in a first direction, the first pad and the second pad both receive a first voltage signal, the third pad receives a second voltage signal, and the first voltage signal is different from the second voltage signal; and in the first direction, a width of the second pad is greater than a width of the first pad and a width of the third pad.

2. The flexible printed circuit of claim 1, wherein the first pad and the second pad are negative electrode pads, and the third pad is a positive electrode pad.

3. The flexible printed circuit of claim 1, wherein:
   the second pad is provided with a central axis extending in a second direction;
   the first direction is perpendicular to the second direction; and
   the first pad and the third pad are symmetrically arranged about the central axis.

4. The flexible printed circuit of claim 3, wherein:
   widths, in the second direction, of the first pad, the second pad and the third pad are same; and
   a width, in the first direction, of the first pad is same as the width, in the first direction, of the third pad.

5. The flexible printed circuit of claim 1, wherein a distance between the first pad and the second pad is same as a distance between the second pad and the third pad.

6. The flexible printed circuit of claim 1, wherein the first pad and the third pad are square in shape.

7. The flexible printed circuit of claim 1, further comprising:
   a line layer; and
   a circuit structure;
   the line layer comprising a plurality of lead wires for connecting the LED pads and the circuit structure;
   wherein the first pad and the third pad are respectively connected to at least one of the lead wires; and
   at least one lead wire connected to the first pad and at least one lead wire connected to the third pad are symmetrically arranged relative to a central axis of the second pad.

8. The flexible printed circuit of claim 7, wherein:
   the first pad is connected to a first lead wire, a second lead wire and a third lead wire respectively, the first pad comprises a first side edge arranged opposite to the second pad, and the first lead wire, the second lead wire and the third lead wire are respectively electrically connected to other side edges other than the first side edge of the first pad;
   the third pad is connected to a fourth lead wire, a fifth lead wire and a sixth lead wire respectively, the third pad comprises a second side edge arranged opposite to the second pad, and the fourth lead wire, the fifth lead wire and the sixth lead wire are respectively electrically connected to other side edges other than the second side edge of the third pad; and
   the first lead wire and the fourth lead wire are symmetrically arranged relative to the central axis of the second pad, the second lead wire and the fifth lead wire are symmetrically arranged relative to the central axis of the second pad, and the third lead wire and the sixth lead wire are symmetrically arranged relative to the central axis of the second pad.

9. The flexible printed circuit of claim 8, wherein the first lead wire, the second lead wire, the third lead wire, the fourth lead wire, the fifth lead wire and the sixth lead wire are connected to center positions of the corresponding side edges respectively.

10. The flexible printed circuit of claim 7, wherein the second pad comprises:
   a third side edge arranged opposite to the first pad;
   a fourth side edge arranged opposite to the third pad; and
   a fifth side edge and a sixth side edge which are arranged opposite to each other and adjacent to the third side edge and the fourth side edge;
   wherein the second pad is connected to an even number of lead wires, and the even number of lead wires are connected to the fifth side edge and the sixth side edge respectively.

11. The flexible printed circuit of claim 10, wherein:
the fifth side edge is connected to a seventh lead wire; and
the sixth side edge is connected to an eighth lead wire;
wherein the seventh lead wire is connected to a center position of the fifth side edge, and the eighth lead wire is connected to a center position of the sixth side edge.

12. A light bar, comprising the flexible printed circuit as claimed in claim 1, and a plurality of LED lamp beads welded on the flexible printed circuit through the plurality of groups of LED pads.

13. A backlight module, comprising the light bar as defined in claim 12.

14. A liquid crystal display device, comprising the backlight module as defined in claim 13.

* * * * *